(12) United States Patent
Deng et al.

(10) Patent No.: US 10,993,360 B2
(45) Date of Patent: Apr. 27, 2021

(54) ASSEMBLY SYSTEM

(71) Applicants: Tyco Electronics (Shanghai) Co. Ltd., Shanghai (CN); TE Connectivity Corporation, Berwyn, PA (US); Kunshan League Automechanism Co., Ltd., Kunshan (CN); Tyco Electronics Polska Sp. z.o.o., Warsaw (PL)

(72) Inventors: Yingcong Deng, Shanghai (CN); Jaroslaw Kowalski, Bydgoszcz (PL); Andrzej Przybylski, Bydgoszcz (PL); Jaroslaw Grzebski, Bydgoszcz (PL); Dandan Zhang, Shanghai (CN); Lvhai Hu, Shanghai (CN); Fengchun Xie, Shanghai (CN); Yun Liu, Shanghai (CN); Roberto Francisco-Yi Lu, Bellevue, WA (US); Haidong Wu, Kunshan (CN); Hui Xiao, Kunshan (CN)

(73) Assignees: Tyco Electronics (Shanghai) Co. Ltd., Shanghai (CN); TE Connectivity Corporation, Berwyn, PA (US); Kunshan League Automechanism Co., Ltd., Kunshan (CN); Tyco Electronics Polska Sp. z.o.o., Warsaw (PL)

( * ) Notice: Subject to any disclaimer, the term of this patent is extended or adjusted under 35 U.S.C. 154(b) by 268 days.

(21) Appl. No.: 16/169,511

(22) Filed: Oct. 24, 2018

(65) Prior Publication Data

US 2019/0124805 A1 Apr. 25, 2019

(30) Foreign Application Priority Data

Oct. 25, 2017 (CN) .......................... 201711007567.1

(51) Int. Cl.
*B23P 19/00* (2006.01)
*H05K 13/04* (2006.01)
(Continued)

(52) U.S. Cl.
CPC ......... *H05K 13/0452* (2013.01); *H01R 43/20* (2013.01); *H05K 13/0406* (2018.08);
(Continued)

(58) Field of Classification Search
None
See application file for complete search history.

(56) References Cited

U.S. PATENT DOCUMENTS 2,829,423 A * 4/1958 Long ...................... H01R 43/20
29/33 R
2017/0057025 A1* 3/2017 Dai .......................... B23P 19/04

\* cited by examiner

*Primary Examiner* — Thiem D Phan
(74) *Attorney, Agent, or Firm* — Barley Snyder

(57) ABSTRACT

An assembly system comprises a fixing device configured to fix a housing and a pressing mechanism adapted to assemble a contact into the housing. The pressing mechanism includes a fixing block having a contact guiding slot adapted to receive the contact therein and a movable block movably mounted on the fixing block and adapted to press the contact downward. The movable block is moved downward to press the contact received in the contact guiding slot into a contact installation slot of the housing in a condition in which the contact guiding slot of the fixing block is aligned with the contact installation slot of the housing.

19 Claims, 4 Drawing Sheets

(51) Int. Cl.
   *H05K 13/08* (2006.01)
   *H01R 43/20* (2006.01)
(52) U.S. Cl.
   CPC ..... *H05K 13/0413* (2013.01); *H05K 13/0812* (2018.08); *Y10T 29/53174* (2015.01)

ASSEMBLY SYSTEM

CROSS-REFERENCE TO RELATED APPLICATION

This application claims the benefit of the filing date under 35 U.S.C. § 119(a)-(d) of Chinese Patent Application No. 201711007567.1, filed on Oct. 25, 2017.

FIELD OF THE INVENTION

The present invention relates to an assembly system and, more particularly, to an assembly system adapted to insert a contact into a housing.

BACKGROUND

In electrical connector manufacturing, metal contacts are often inserted into an insulation housing. The insertion of the metal contacts is usually performed manually. During insertion of the metal contacts, an operator needs to grasp the metal contact by hand and force it into a contact installation slot of the insulation housing. However, during insertion, an operator's hand is prone to shaking, which will bend the metal contact, resulting in deformation or damage of the metal contact and reducing a quality of the assembled electrical connector. Furthermore, manually inserting the metal contacts is an inefficient assembly operation.

SUMMARY

An assembly system comprises a fixing device configured to fix a housing and a pressing mechanism adapted to assemble a contact into the housing. The pressing mechanism includes a fixing block having a contact guiding slot adapted to receive the contact therein and a movable block movably mounted on the fixing block and adapted to press the contact downward. The movable block is moved downward to press the contact received in the contact guiding slot into a contact installation slot of the housing in a condition in which the contact guiding slot of the fixing block is aligned with the contact installation slot of the housing.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
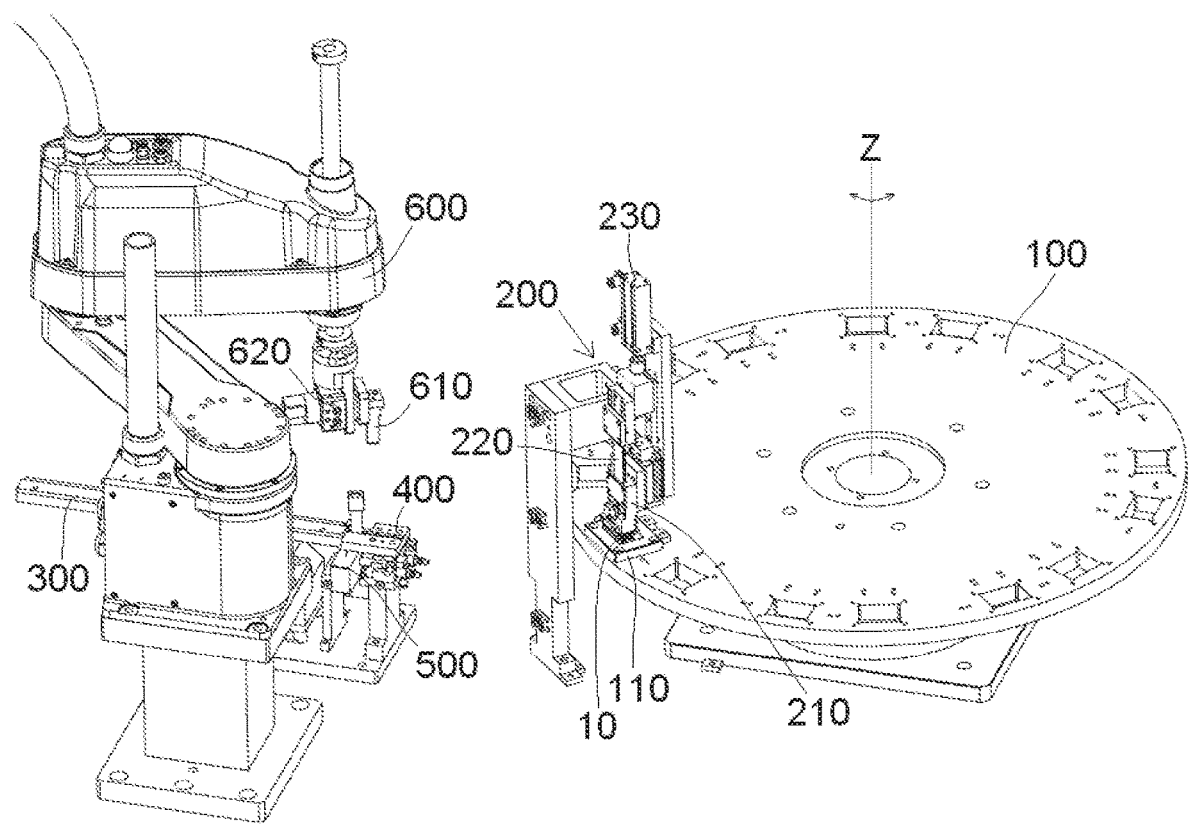
FIG. 1 is a perspective view of an assembly system according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An assembly system according to an embodiment is shown in FIG. 1. The assembly system comprises a fixing device 110 and a pressing mechanism 200. The fixing device 110 is configured to fix a housing 10, for example, an insulation housing of a connector. The pressing mechanism 200 is adapted to assemble a contact 20, shown in FIGS. 2 and 3, into the housing 10.

Figure 4:
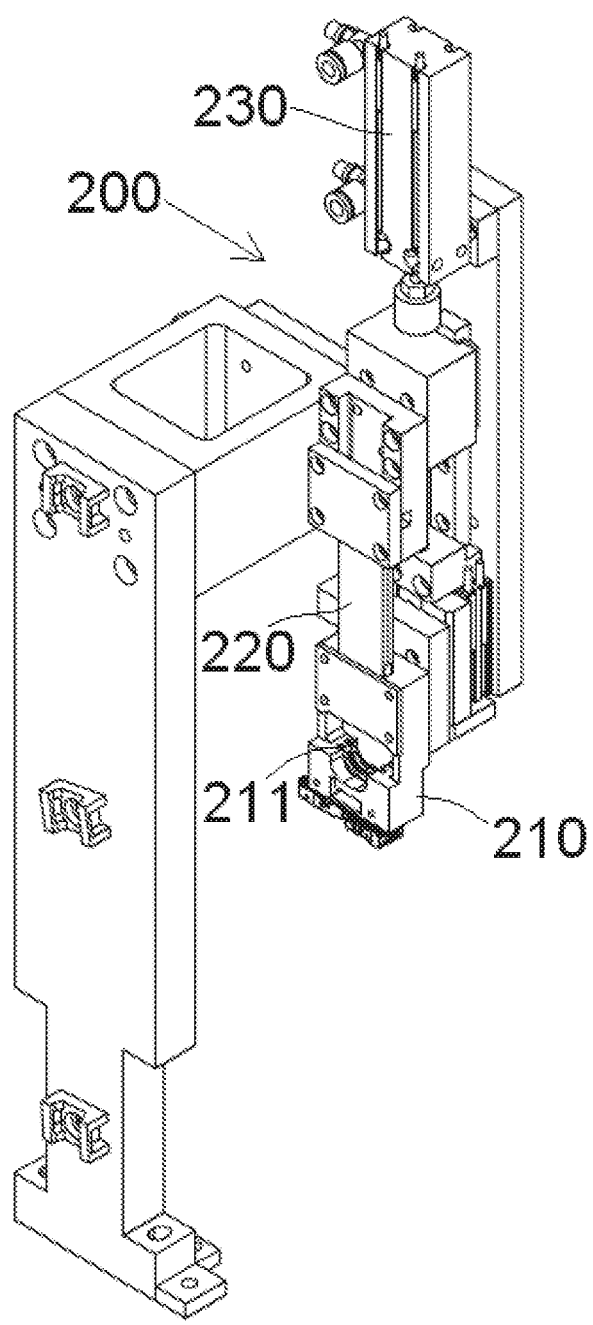
FIG. 4 is a perspective view of a pressing mechanism of the assembly system of FIG. 1.

The pressing mechanism 200, as shown in FIGS. 1 and 4, includes a fixing block 210 and a movable block 220. The fixing block 210 has a contact guiding slot 211 adapted to receive the contact 20 therein. The movable block 220 is movably mounted on the fixing block 210 and adapted to press the contact 20 downward. The movable block 220 is driven to move downward to press the contact 20 received in the contact guiding slot 211 into a contact installation slot of the housing 10 in a condition in which the contact guiding slot 211 of the fixing block 210 is aligned with a contact installation slot of the housing 10.

The assembly system, as shown in FIG. 1, comprises a rotatable table 100 rotatable about a vertical axis Z. The fixing device 110 is mounted on the rotatable table 100, and the rotatable table 100 is adapted to rotate the fixing device 110 to a contact assembly station where the contact installation slot of the housing 10 fixed on the fixing device 110 is aligned with the contact guiding slot 211 of the fixing block 210 on the pressing mechanism 200. In this way, when movable block 220 is moved downward, the contact 20 received in the contact guiding slot 211 may be pressed into the contact installation slot of the housing 10. As shown in FIG. 1, in an embodiment, a plurality of fixing devices 110 are mounted on the rotatable table 100 around the periphery of rotatable table 100 and separated from each other. The rotatable table 100 is adapted to rotate the plurality of fixing devices 110 to the contact assembly station one by one.

The pressing mechanism 200, as shown in FIGS. 1 and 4, comprises a driving device 230 configured to drive the movable block 220 to move downward. In various embodiments, the driving device 230 may comprise a motor, an air cylinder, or a hydraulic cylinder. In an embodiment, a plurality of contact guiding slots 211 are formed in the fixing block 210 and a plurality of contact installation slots are formed in the housing 10, each contact installation slot being constructed to hold one contact therein. The pressing mechanism 200 is adapted to simultaneously press the plurality of contacts 20 received in the plurality of contact guiding slots 211, respectively, into the plurality of contact installation slots.

The assembly system, as shown in FIG. 1, comprises a robot 600 adapted to grip the contact 20 and insert the gripped contact 20 into the contact guiding slot 211 of the fixing block 210.

Figure 2:
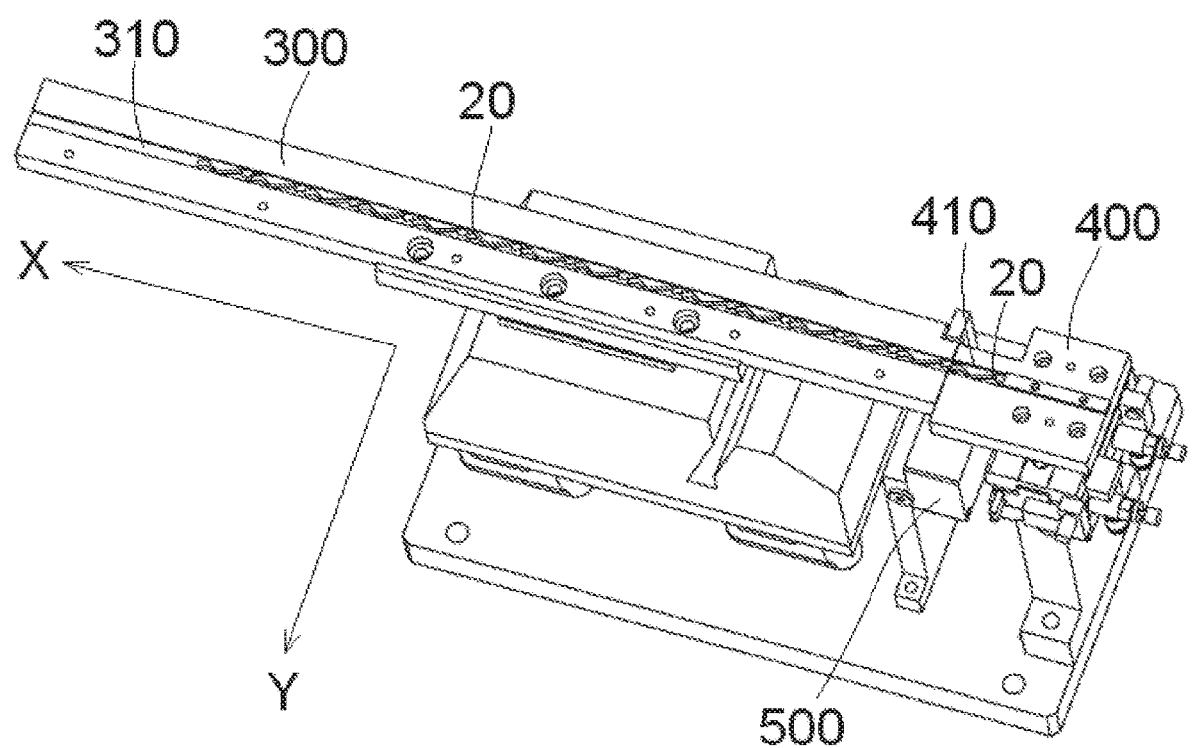
FIG. 2 is a perspective view of a contact supply mechanism, a contact positioning mechanism, and a contactless sensor of the assembly system of FIG. 1.
Figure 3:
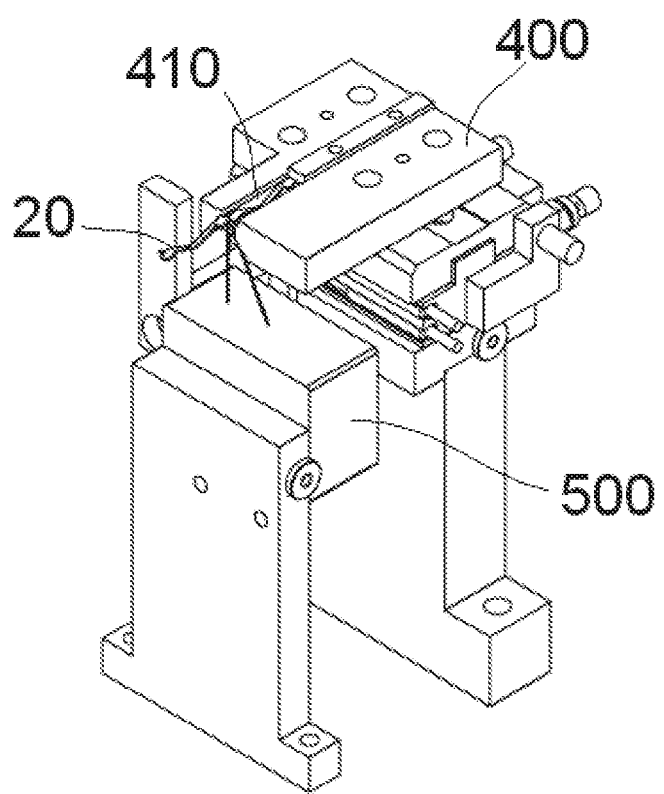
FIG. 3 is a perspective view of the contact positioning mechanism and the contactless sensor of the assembly system of FIG. 1.

The assembly system, as shown in FIGS. 1-3, comprises a contact supply mechanism 300 configured to supply the contact 20 to be assembled and a contact positioning mechanism 400 formed with a contact positioning slot 410 in which the contact 20 is positioned. The contact supply mechanism 300 includes a linear vibration guide 310 extending in a first horizontal direction X, and the contacts 20 to be assembled are adapted to be loaded in the linear vibration guide 310. The contact positioning slot 410 of the contact positioning mechanism 400 is located at one end of the linear vibration guide 310 and aligned to the linear vibration guide 310. The linear vibration guide 310 is adapted to drive the contacts 20 by vibration, so as to move the contacts 20 toward the contact positioning slot 410 of the contact positioning mechanism 400.

The contact positioning mechanism 400, shown in FIGS. 1-3, is configured to be movable in a second horizontal direction Y perpendicular to the first horizontal direction X. The contact positioning mechanism 400 is moved in the second horizontal direction Y and separated from the linear vibration guide 310 after the contact 20 is moved from the linear vibration guide 310 into the contact positioning slot 410. The contact positioning slot 410 of the contact positioning mechanism 400 is adapted to position the contact 20 in a horizontal posture.

The assembly system, as shown in FIGS. 1-3, comprises a contactless sensor 500 configured to detect whether the contact 20 in the contact positioning mechanism 400 is qualified. If the contact 20 is not qualified, then the robot 600 will grip and discard the unqualified contact 20. In various embodiments, the contactless sensor 500 may comprise a distance sensor, a visual sensor, or an infrared sensor. In an embodiment, the contactless sensor 500 is fixed to the contact positioning mechanism 400 and moved together with the contact positioning mechanism 400 in the second horizontal direction Y.

As shown in FIG. 1, the robot 600 includes a manipulator 610 adapted to grip the contact 20 positioned in the horizontal posture from the contact positioning slot 410. The robot 600 includes a rotation mechanism 620 adapted to rotate the manipulator 610, so as to rotate the contact 20 from the horizontal posture to a vertical posture. The robot 600 is adapted to insert the gripped contact 20 in the vertical posture into the contact guiding slot 211 of the pressing mechanism 200.

A method of assembling the contact 20 into the housing 10 comprises steps of:
providing the assembly system as described above;
a first step including:
supplying the contact 20 to the contact positioning mechanism 400 by the contact supply mechanism 300;
moving the contact positioning mechanism 400 to separate it from the contact supply mechanism 300;
detecting whether the contact 20 in the contact positioning mechanism 400 is qualified by the contactless sensor 500;
gripping the contact 20 in the horizontal posture from the contact positioning mechanism 400 by the robot 600;
rotating the gripped contact 20 from the horizontal posture to the vertical posture by the robot 600; and
inserting the gripped contact 20 in the vertical posture into the contact guiding slot 211 of the pressing mechanism 200 by the robot 600, and
a second step performed simultaneously with the first step and including: mounting the housing 10 on the fixing device 110; and
rotating the fixing device 110 by the rotatable table 100 to the contact assembly station; and
a third step including pressing the contact 20 into the housing 10 by the pressing mechanism 200.

The assembly system automatically assembles the contact 20 into the housing 10. The assembly system thereby improves the efficiency of assembling the contact 20 into the housing 10, preventing the contact 10 from being damaged during assembly and improving the quality of the assembly product.

What is claimed is:

1. An assembly system, comprising:
a fixing device configured to fix a housing; and
a pressing mechanism adapted to assemble a contact into the housing and including a fixing block having a contact guiding slot adapted to receive the contact therein and a movable block movably mounted on the fixing block and adapted to press the contact downward, the movable block is moved downward to press the contact received in the contact guiding slot into a contact installation slot of the housing in a condition in which the contact guiding slot of the fixing block is aligned with the contact installation slot of the housing.

2. The assembly system of claim 1, further comprising a rotatable table configured to be rotated about a vertical axis, the fixing device is mounted on the rotatable table and the rotatable table is adapted to rotate the fixing device to a contact assembly station where the contact installation slot of the housing fixed on the fixing device is aligned with the contact guiding slot of the fixing block on the pressing mechanism.

3. The assembly system of claim 2, wherein a plurality of fixing devices are mounted on the rotatable table around a periphery of the rotatable table and are separated from each other, and the rotatable table is adapted to rotate the plurality of fixing devices to the contact assembly station one by one.

4. The assembly system of claim 2, further comprising a robot adapted to grip the contact and insert the contact into the contact guiding slot of the fixing block.

5. The assembly system of claim 4, further comprising a contact supply mechanism configured to supply the contact to be assembled.

6. The assembly system of claim 5, further comprising a contact positioning mechanism having a contact positioning slot in which the contact is positioned.

7. The assembly system of claim 6, wherein the contact supply mechanism includes a linear vibration guide extending in a first horizontal direction, the contact being loaded in the linear vibration guide.

8. The assembly system of claim 7, wherein the contact positioning slot of the contact positioning mechanism is located at an end of the linear vibration guide and aligned with the linear vibration guide, and the linear vibration guide is adapted to drive the contact by vibration to move the contact toward the contact positioning slot of the contact positioning mechanism.

9. The assembly system of claim 8, wherein the contact positioning mechanism is configured to be movable in a second horizontal direction perpendicular to the first horizontal direction, the contact positioning mechanism is moved in the second horizontal direction and separated from the linear vibration guide after the contact is moved from the linear vibration guide into the contact positioning slot.

10. The assembly system of claim 9, further comprising a contactless sensor configured to detect whether the contact in the contact positioning mechanism is qualified.

11. The assembly system of claim 10, wherein the contactless sensor is a distance sensor, a visual sensor, or an infrared sensor.

12. The assembly system of claim 10, wherein the contactless sensor is fixed to the contact positioning mechanism and moved together with the contact positioning mechanism in the second horizontal direction.

13. The assembly system of claim 9, wherein the contact positioning slot of the contact positioning mechanism is adapted to position the contact in a horizontal posture.

14. The assembly system of claim 13, wherein the robot includes a manipulator adapted to grip the contact positioned in the horizontal posture from the contact positioning mechanism.

15. The assembly system of claim 14, wherein the robot further comprises a rotation mechanism adapted to rotate the manipulator to rotate the contact from the horizontal posture to a vertical posture.

16. The assembly system of claim 15, wherein the robot is adapted to insert the contact in the vertical posture into the contact guiding slot of the pressing mechanism.

17. The assembly system of claim 1, wherein the pressing mechanism further comprises a driving device configured to drive the movable block to move downward.

18. The assembly system of claim 17, wherein the driving device is a motor, an air cylinder, or a hydraulic cylinder.

19. The assembly system of claim 1, wherein a plurality of contact guiding slots are formed in the fixing block and a plurality of contact installation slots are formed in the housing, and the pressing mechanism is adapted to simultaneously press a plurality of contacts received in the plurality of contact guiding slots into the plurality of contact installation slots.

* * * * *